United States Patent [19]

Zimmer

[11] Patent Number: 4,952,778
[45] Date of Patent: Aug. 28, 1990

[54] HEATED TOOL WITH HEATED GAS SOURCE

[75] Inventor: Gero Zimmer, Munich, Fed. Rep. of Germany

[73] Assignee: Productech Inc., Rolling Hills Estates, Calif.

[21] Appl. No.: 275,332

[22] Filed: Nov. 22, 1988

[30] Foreign Application Priority Data

Nov. 24, 1987 [DE] Fed. Rep. of Germany ....... 3739750

[51] Int. Cl.[5] .............................................. H05B 1/00
[52] U.S. Cl. ................................... 219/243; 219/254; 219/553
[58] Field of Search .............. 219/243, 245, 254, 258, 219/552, 553

[56] References Cited

U.S. PATENT DOCUMENTS 4,205,221 5/1980 Meyer ............................... 219/85.16

Primary Examiner—C. L. Albritton
Attorney, Agent, or Firm—Notaro & Michalos

[57] ABSTRACT

An apparatus for connecting one object to another by heating the objects comprises a heated tool having a heater bar with a heating surface for contacting one of the objects. The tool can be moved with pressure against one of the objects for heating the objects. One or more nozzles are provided for directing heated gas in a flow either against the heater bar or against one of the objects for better controlling the heat transfer to the objects.

18 Claims, 4 Drawing Sheets

HEATED TOOL WITH HEATED GAS SOURCE

FIELD AND BACKGROUND OF THE INVENTION

The present invention relates in general to heating tools for thermally treating objects and/or for connecting objects together by welding, soldering, or gluing. The heating tools may either be moved to the objects to be treated or mounted in a fixed position, with the objects to be treated being brought to the heated tool.

Thermal energy is either supplied to the objects to be treated (e.g. to connect them to each other), by radiant heating from heated surfaces of the tool, or by direct thermal contact between the heated tool and the object. A controlled force is usually applied against the object by the heated tool. An additional thermal conductive material may be used to increase heat flow from the heated tool to the object. Flux, for example, may be provided for increasing the transfer of heat and for reducing oxidation during the thermal process.

Such tools may supply heat either continuously or during selected time periods only. Heat may be applied during heating pulses which may be activated or controlled by various external conditions, for example, by forcing the heated tool against the object to be heated or connected.

Various sources of heat are known for heating the heated tool to a variety of selected temperatures. Hot gases and/or electric current for example may be used for heating specified heat supplying areas or surfaces of the tool.

For the present invention, it is preferable to utilize the flow of electrical current through a heated tool for heating the tool. This permits controlled pulse-heating featuring fast heating rates as well as precise temperature control at various areas of the tool.

A known generally U-shaped heated tool is disclosed in German Patent reference 2,848,519. This heated tool is mounted to holders either using screws or by welding. This keeps the heat supplying areas of the tool in position and further is used to provide electrical connectors for feeding electrical heating current to the tool. Such tools can be manufactured using sheet metal designs (see German Patents 3,144,048.7, 3,137,859.5 and 3,137,860.9 to the present inventor). These heated tools can also be machined from solid materials.

When transferring thermal energy to one or more objects using one or more heated tools, excess heat and relatively long periods of time are sometimes needed, particularly when the objects are made of materials having high thermal loads.

The use of force-controlled thermal contact for transferring thermal energy from a tool to a part must also be accurately controlled. For this reason force-controlled thermal contact has limited applications. Objects having high thermal conductivity, for example objects made of metal oxides, require different procedures. Continuous preheating for example may be necessary for such applications. A heating tool is simply set at a much higher temperature to compensate for thermal loads. This has limitation however in that excess heat may be damaging to some materials.

FIG. 1 illustrates a typical configuration for connecting a first object 4, in this case a ribbon or wire extending from an electronic component 6, to a second object 5 in this case a metallization layer on a substrate 5. To this end, a heated tool 1 is applied with a force in the direction of arrows 3 against the first object 4 to heat it and press it against the second object 5. The force and heat of the heated tool 1 is intended to melt a solder coating on the first object 4 as well as a solder coating on the second object 5 in order to melt the solders and connect the objects to each other. The intention is to utilize force in the direction of arrows 3 to simultaneously melt solders to join the object.

This process becomes more critical and difficult however if substrate 5 is made of material having a high thermal load. The temperature at object 4 will lose heat through substrate 5 and therefore be cooler than heated tool 1. The wire or ribbon of object 4 represents an additional thermal resistance between heated tool 1 and object 4. In order to melt the solder below the object therefore heated tool 1 must be brought to a much higher temperature. This increases the chances of damaging sensitive nearby parts, such as the electronic component 6. This also requires excessive heat and time to make the connection.

The operation of transferring thermal energy to the objects becomes even more critical if high thermal loads are applied to the heat supplying area 1a of the heated tool 1.

SUMMARY OF THE INVENTION

An object of the present invention is to compensate for or reduce the thermal loads to which the heat supplying area of a heated tool is exposed, while maintaining control over the characteristic features of the heated tool, such as the force being applied by the heated tool and the temperature of the heated tool, as well as the defined heated area of the heated tool.

In accordance with the present invention, additional thermal energy is applied to the thermal loads, namely the first and/or second objects to be connected to each other using the heated tool. By increasing temperature at these loads, the effect of the thermal loads is reduced in the heat transferring area of the heated tool. This is done by using additional temperature-control and directed gas flow for a faster heating up of the objects. This also compensates for and reduces thermal heat flow applied by the heat transferring area of the heated tool, to the objects. Such additional control gas may be set to a temperature which is identical to that of the heat transferring area of the heated tool. Alternatively, the gas can be at a different, preferably higher temperature. The temperature profile or times at which the gas is at certain temperatures, can also be controlled.

According to the present invention, heated gases are directed toward various parts of the thermal loads, i.e. the objects to be connected to each other. This still permits the basic thermal heat transfer to be controlled by the heated area of the heated tool, as a function of the thermal contact and applied force between the tool and the objects to be connected.

DESCRIPTION OF THE PREFERRED EMBODIMENTS

Figure 1:
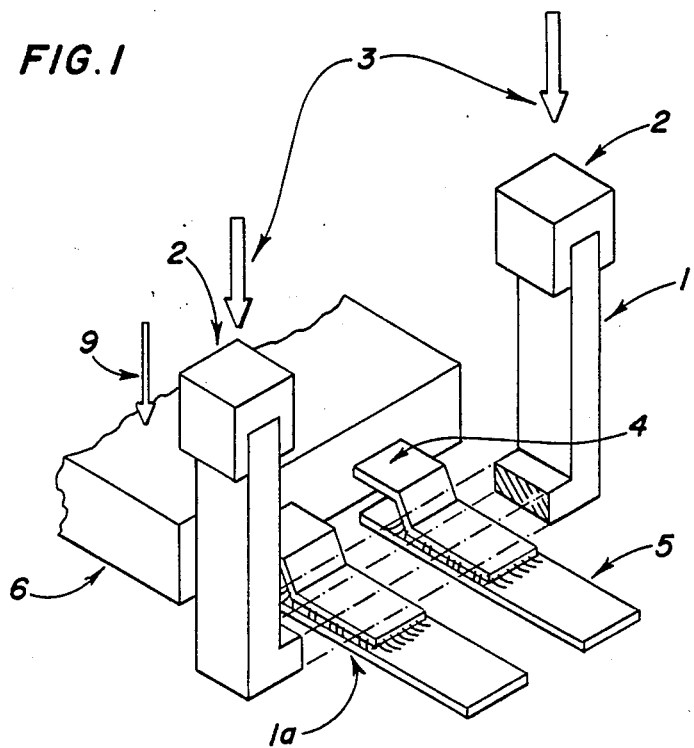
FIG. 1 is a perspective, schematic view of a known heated tool used for connecting two or more objects to each other.
Figure 2:
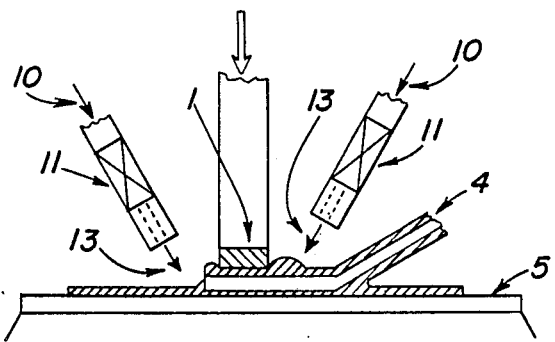
FIG. 2 is a schematic sectional view showing the basic principles of the present invention.
Figure 2A:
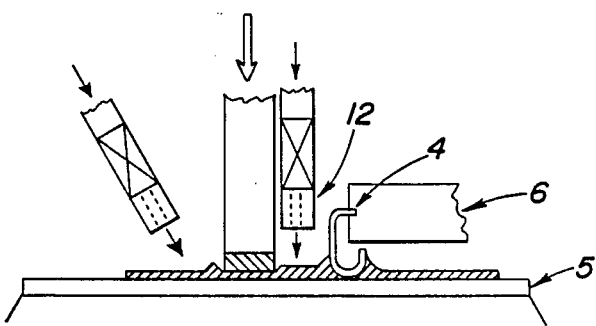
FIG. 2a is a view similar to FIG. 2 showing a different aiming direction for nozzles used to supply heated gas in accordance with the present invention.
Figure 2B:
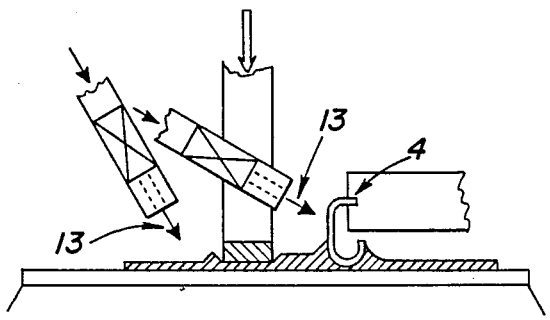
FIG. 2b is a view similar to FIG. 2 of a still further configuration for the nozzles.

Referring to the drawings in particular, the invention embodied in FIG. 2 comprises an apparatus for connecting one object 4 to another object 5, by heated the objects, the apparatus comprising a heated tool 1 having a heater bar with a heating surface for contacting one of objects, means for moving the tool into contact with one of the objects, schematically shown by a downwardly directed arrow in tool 1, the direction being toward at least one of the objects, and gas directing means for directing a flow of heated gas against either the heated bar or one of the objects near the heated bar. As shown in FIG. 2, a pair nozzles on opposite side of the heated tool 1 are provided for directing gas flows 13, at angles toward the heated tool against objects 4 and 5. The nozzles may be provided with heaters 11 for heating the gas. The gas flow may be heated at a time which is synchronized with the pulse heating of the heater bar. Alternatively, the gas flow may be provided at a different time, or heated at a different time. This produces advantages such as the ability to preheat portions of the objects 4 or 5 prior to applying the thermal energy by the heated tool. Typically this serves to evaporate solvent out of fluxes which are conventionally used in solders for connecting the objects 4 and 5 as required to form the solder joint between the objects. FIG. 2a shows an embodiment of the invention wherein one of the nozzles, which is labeled 12 in FIG. 2a, directs its flow of heated gas directly at the thermal load 5. The gas flows only partly against the object 4 which in this case is a ribbon or wire lead from the component 6. Nozzle 12 directs its flow of headed gas onto an area of thermal load or object 5, between the heated tool and the lead 4. FIG. 2b shows an embodiment wherein one of the nozzles directs its flow of heated gas 13 against the lead 4 only. This configuration is advantageous when lead 4 represents a particularly high thermal load.

Figure 2C:
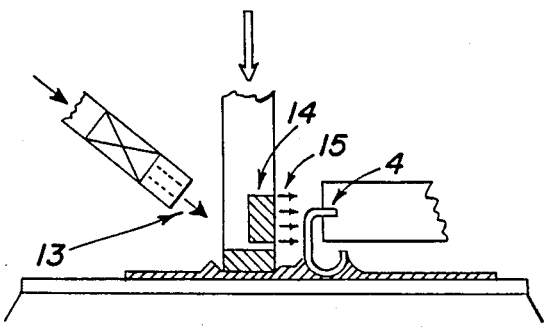
FIG. 2c is a view similar to FIG. 2 of an embodiment of the invention utilizing a nozzle for heated gas in conjunction with an additional radiating heat source.

FIG. 2c shows an embodiment of the invention which uses one nozzle for directing a stream of heated gas 13 toward the heater bar of the heated tool. Rather than including a second nozzle an additional radiating heat source 14 is mounted on the heated tool for additionally heating the flow of gas and producing additional radiant heat 15 for thermally treating the object 4 and/or object 5 to which object 4 is to be connected.

Figure 3A:
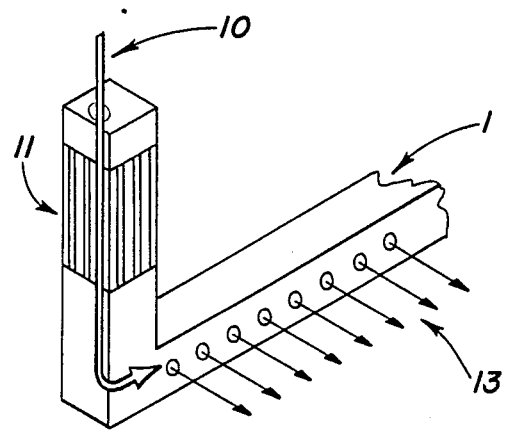
FIG. 3a is a partial schematic view showing a different embodiment of the invention for applying additional thermally controlled gas to an area to be thermally treated.

FIG. 3a, shows an embodiment of the invention wherein the additional thermally controlled gas is supplied to the area that is thermally heated by the heater bar of the heated tool 1. Gas 10 flows through a passage in the heated tool 1 which is provided with an auxiliary heater 11. Multiple apertures are provide in the heater bar of the heated tool for discharging divided flows of heated gas 13 to the objects to be heat treated.

Figure 3B:
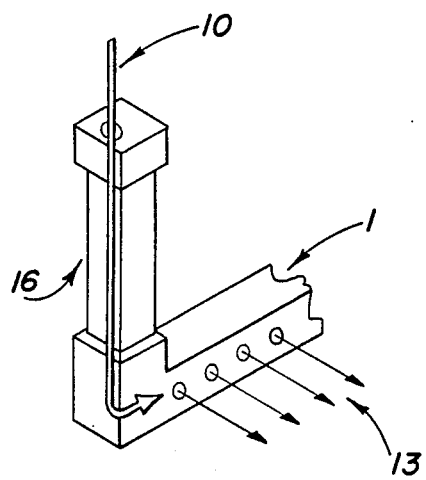
FIG. 3b is a view similar to FIG. 3a of another embodiment of the invention.

FIG. 3b shows an embodiment similar to FIG. 3a. In FIG. 3b, heating of the gas flow is achieved by simply changing the cross-sectional area 16 of the heater bar for the heated tool 1. This increases the temperature at area 16, causing a further heating effect of the flow of gas. Additional heating is provided since the heated tool is heated by the passage of current, and current passing through the smaller cross-sectioned area 16 experiences a greater resistance which produces a greater heating effect. This simplifies the mechanical design of the invention without requiring any additional control for the timing and temperature of the gas flow. The gas temperature may easily be preset by design of the cross-sectional area 16 as well as by the amount of gas flowing through the passage of the heated tool. After turning the electrical current off, the gas flow may be continued for a fast cooling of the entire device.

Figure 4A:
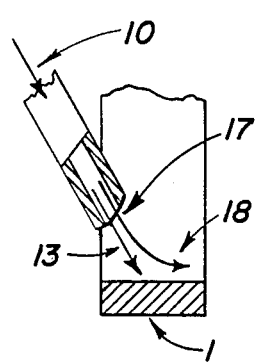
FIG. 4a is a partial, schematic sectional view showing a further embodiment of the invention wherein the gas nozzle is directed toward a heater bar of the heated tool.

FIG. 4a shows a use of a nozzle for receiving a flow of gas 10 and discharging a flow of heated gas 13, which is directed towards the heated bar of the heated tool 1, either in its entirety or only partly, in order to effect the temperature of the gas as well as the temperature of the heater bar. The shape 17 of the nozzle is designed to direct the flow in order to allow most of the gas to be directed toward the thermal loads (e.g. the object to be connected to each other).

Figure 4B:
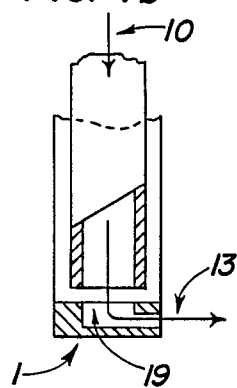
FIG. 4b is a view similar to FIG. 4a of an embodiment of the invention wherein heated gases pass through a passage in the heater bar.
Figure 4E:
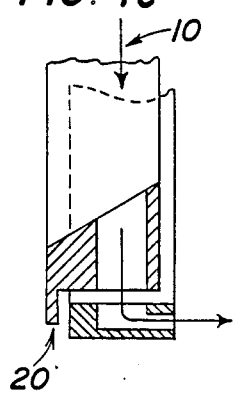
FIG. 4e is a view similar to FIG. 4b showing a similar embodiment to that of FIG. 4b including a deflector for directing the flow of heated gas.

FIG. 4b shows a configuration wherein the gas flows first through holes or formed shapes 19 in the heater bar 1. An additional deflector or shaped portion 20 can be connected to the nozzle as shown in FIG. 4e to direct the gas flow into required directions. This eliminates seals which may otherwise be required to confine the gas flow.

Figure 4C:
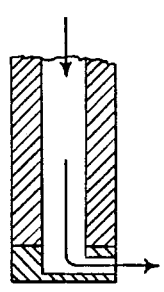
FIG. 4c is a view similar to FIG. 4a, but showing an embodiment which is similar to that of FIG. 3a wherein channels are formed in the heated tool to direct the gases toward the thermal loads to be heated.
Figure 4F:
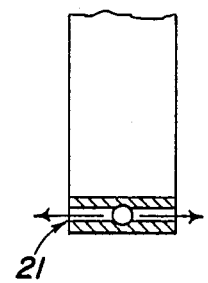
FIG. 4f is a view similar to FIG. 4c, showing a similar embodiment where the passages are configured differently.
Figure 4G:
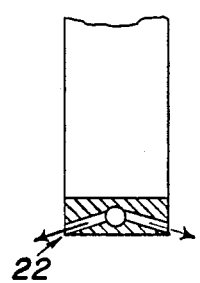
FIG. 4g is a view similar to FIG. 4f, showing a similar embodiment with a still different configuration for the passages.

FIG. 4c shows an embodiment of the invention similar to that of FIG. 3a. Channels for guiding the gas are defined in the heated tool, and in particularly in the heater bar, to direct the gases toward the thermal loads. Apertures may be provided on one or more sides of the heater bar for this purpose. Further, such gas flow may be directed almost parallel to the surface of at least one of the objects to be connected as shown at 21 in FIG. 4f. An non-parallel orientation shown at 22 in FIG. 4g may also be provided in order to effect a thermal heat transfer.

Figure 4D:
FIG. 4d is a view similar to FIG. 4a of a further embodiment of the invention wherein differently configured passages are defined in the heated tool.
Figure 4H:
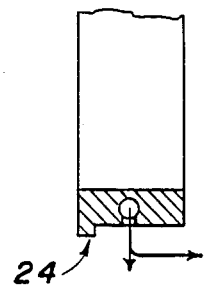
FIG. 4h is a view similar to FIG. 4d, showing a similar embodiment with a deflector for directing the flow of gas.

FIG. 4d shows an embodiment of the invention wherein a passage through the heater bar is provided with downwardly extending apertures 23 for directing the gas flow into the heat transferring area of the heater bar. This configuration allows for an extremely fast heat transfer to the thermal loads. FIG. 4h shows an embodiment similar to FIG. 4d wherein an additional bar 24 is provided for supporting and directing the fast heat transfer effect.

In each of the embodiments of the invention, the heating gas is directed at a non-zero angle with respect to the direction of pressure which is applied to the heater bar, and against an area of the object to be heated which is spaced from the contact are against which the heater bar is pressed.

What is claimed is:

1. An apparatus for connecting one object to another by heating the objects, comprising:
   a heated tool having a heater bar with a heating surface for contacting a contact surface of at least one of the object;
   means for moving the tool into contact with the contact surface in a force direction toward at least one of the objects; and
   gas directing means for directing a flow of heated gas at a non-zero angle to the force direction and against at least one of the objects adjacent the heater bar at a location spaced from the contact surface for providing additional thermal energy to at least one of the objects.

2. An apparatus according to claim 1 wherein said heater bar is electrically heated and receives electricity for heating the heater bar with the same timing as the flow of heated gas from the gas directing means.

3. An apparatus according to claim 1 wherein the heater bar is electrically heated at a time different from the flow of heated gas from the gas directing means.

4. An apparatus according to claim 1 wherein said gas directing means comprises at least one gas nozzle for directing the flow of heated has against the heater bar.

5. An apparatus according to claim 1 wherein the gas directing means comprises at least one nozzle including additional heating means for heating the flow of gas passing through the nozzle.

6. An apparatus according to claim 1 wherein the gas directing means comprises at least one nozzle for directing the flow of heated gas against one of the objects.

7. An apparatus according to claim 6 wherein said gas directing means includes a second nozzle for directing an additional flow of gas against the other object.

8. An apparatus according to claim 1 including a radiant heater connected to said heater bar, said gas directing means comprising a nozzle for directing a flow of gas against the radiant heater.

9. An apparatus according to claim 1 wherein said gas directing means comprises a passage extending through at least part of said heater bar and at least one orifice extending out through a surface of said heater bar for discharging the flow of heated gas.

10. An apparatus for connecting one object to another by heating the objects, comprising:
    a heated tool having a heater bar with a heating surface for connecting at least one of the objects;
    means for moving the tool into contact with at least one of the objects in a direction toward at least one of the objects; and
    gas directing means for directing a flow of heated gas against at least one of the objects adjacent the heater bar for providing additional thermal energy to at least one of the objects, said gas directing means comprising a passage extending through at least part of said heater bar and at least one orifice extending out through a surface of said heater bar for discharging the flow of heated gas, the heater bar being electrically heated and including auxiliary means connected to the heater bar around at least part of the flow of gas through the heater bar for additionally heating the flow of gas.

11. An apparatus according to claim 10 wherein said auxiliary heater comprises an area of reduced cross-section of said heater bar.

12. An apparatus according to claim 1 wherein said gas directing means comprises a passage extending through the heater bar and a plurality of apertures communicating with the passage and extending out through the heater bar for directing the flow of heated gas.

13. An apparatus according to claim 12 wherein said apertures are in a heating surface of said heater bar.

14. An apparatus according to claim 12 wherein said apertures extend at an angle to the surface of at least one object.

15. An apparatus according to claim 1 wherein the gas directing means comprises a nozzle for discharging the flow of heated gas, and including a deflector connected to the nozzle for deflecting the flow of gas.

16. An apparatus according to claim 1 wherein the gas directing means comprises a passage in the heater bar, an aperture communicating with the passage and extending through the heater bar for discharging the flow of heated gas, and a deflector bar connected to the heater bar adjacent the aperture for deflecting the flow of gas.

17. An apparatus according to claim 1 wherein the gas directing means includes means for discontinuing the heating of the flow of gas for supplying unheated gas to at least one of the heater bar and object for rapidly cooling the heated bar and objects.

18. An apparatus for connecting one object to another by heating the objects, comprising:
    a heated tool having a heater bar with a heating surface for connecting at least one of the objects;
    means for moving the tool into contact with at least one of the objects in a direction toward at least one of the objects; and
    gas directing means for directing a flow of heated gas against at least one of the objects adjacent the heater bar for providing additional thermal energy to at least one of the objects, said gas directing means comprising a passage extending through the heater bar and a plurality of apertures communicating with the passage and extending out through the heater bar for directing the flow of heated gas, the apertures extending substantially parallel to a surface of at least one of the objects.

* * * * *